US012633938B2

(12) United States Patent
Choi et al.

(10) Patent No.: US 12,633,938 B2
(45) Date of Patent: May 19, 2026

(54) HYBRID DAC-BASED DRIVER STRUCTURE

(71) Applicant: Samsung Electronics Co., Ltd., Gyeonggi-do (KR)

(72) Inventors: Minsoo Choi, Santa Clara, CA (US); Hiep Pham, Saratoga, CA (US); Chih-Wei Yao, Saratoga, CA (US); Hyojun Kim, Milpitas, CA (US)

(73) Assignee: Samsung Electronics Co., Ltd (KR)

( * ) Notice: Subject to any disclaimer, the term of this patent is extended or adjusted under 35 U.S.C. 154(b) by 100 days.

(21) Appl. No.: 18/409,000

(22) Filed: Jan. 10, 2024

(65) Prior Publication Data

US 2025/0125815 A1     Apr. 17, 2025

Related U.S. Application Data

(60) Provisional application No. 63/589,789, filed on Oct. 12, 2023.

(51) Int. Cl.
H03M 1/66          (2006.01)
H03M 1/68          (2006.01)

(52) U.S. Cl.
CPC .............. H03M 1/68 (2013.01); H03M 1/66 (2013.01)

(58) Field of Classification Search
CPC .......... H03M 1/68; H03M 1/72; H03M 1/785; H03M 1/78; H03M 1/66
USPC ........................................ 341/144, 154, 145
See application file for complete search history.

(56) References Cited

U.S. PATENT DOCUMENTS

| | | | |
|---|---|---|---|
| 8,896,472 B2 | 11/2014 | Seo et al. | |
| 9,136,866 B2 | 9/2015 | Downey et al. | |
| 9,887,703 B1 | 2/2018 | Zhang et al. | |
| 9,941,897 B1 * | 4/2018 | Li | H03M 1/201 |
| 10,305,505 B1 * | 5/2019 | Zhang | H03M 1/68 |
| 10,454,487 B1 * | 10/2019 | Sedighi | H03M 1/742 |
| 10,700,699 B1 | 6/2020 | Briaire | |
| 10,951,227 B1 * | 3/2021 | Thinakaran | H03M 1/785 |
| 10,998,113 B2 | 5/2021 | Potasek | |
| 11,469,768 B2 | 10/2022 | Kushnir et al. | |
| 11,637,560 B2 * | 4/2023 | Clara | H03M 1/0639 |
| | | | 341/120 |
| 2008/0309538 A1 * | 12/2008 | Chang | H03M 1/682 |
| | | | 341/145 |

FOREIGN PATENT DOCUMENTS

| | | |
|---|---|---|
| CN | 114650061 | 6/2022 |
| CN | 115694483 | 2/2023 |

* cited by examiner

*Primary Examiner* — Peguy Jean Pierre
(74) *Attorney, Agent, or Firm* — The Farrell Law Firm, P.C.

(57)          ABSTRACT

A hybrid digital-to-analog converter (DAC) driver is provided. The hybrid DAC driver includes an upper DAC stage configured to receive an upper set of bits of a digital signal, the upper DAC stage comprising an upper set of DAC units, with a first DAC unit in the upper set of DAC units having a different weight than a second DAC unit in the upper set of DAC units; a lower DAC stage configured to receive a lower set of bits of the digital signal, the lower DAC stage comprising a lower set of DAC units formed in an R-2R resistor ladder network; and an output stage for outputting an analog signal from the upper DAC stage and the lower DAC stage.

18 Claims, 5 Drawing Sheets

HYBRID DAC-BASED DRIVER STRUCTURE

CROSS-REFERENCE TO RELATED APPLICATION

This application claims the priority benefit under 35 U.S.C. § 119 (e) of U.S. Provisional Application No. 63/589,789, filed on Oct. 12, 2023, the disclosure of which is incorporated by reference in its entirety as if fully set forth herein.

TECHNICAL FIELD

The disclosure generally relates to digital-to-analog converters (DACs). More particularly, the subject matter disclosed herein relates to driver structures for DAC-based transmitters.

SUMMARY

DAC-based transmitter systems may be designed using different weights for the least significant bits (LSBs). However, non-uniformity of DAC units, or individual sections of the DAC, may affect the accuracy and quality of the analog output signal.

When DAC units are non-uniform, it causes a degradation of linearity of an output signal, meaning the output is not a proportional representation of the input, leading to signal distortions. This non-linearity may be problematic in high-fidelity applications like audio and video transmission, where it can result in a loss of clarity and introduce quantization errors. Additionally, non-uniform units complicate the calibration and correction processes, adding complexity and cost to the system.

Given the importance of linearity in DAC performance and the limitations of existing designs, there is a need for a DAC-based driver structure that enhances overall system efficiency and accuracy.

In an embodiment, a hybrid DAC driver is provided. The hybrid DAC driver includes an upper DAC stage configured to receive an upper set of bits of a digital signal, the upper DAC stage comprising an upper set of DAC units, with a first DAC unit in the upper set of DAC units having a different weight than a second DAC unit in the upper set of DAC units; a lower DAC stage configured to receive a lower set of bits of the digital signal, the lower DAC stage comprising a lower set of DAC units formed in an R-2R resistor ladder network; and an output stage for outputting an analog signal from the upper DAC stage and the lower DAC stage.

In an embodiment, a method for driving a load using a hybrid DAC driver is provided. The method includes receiving an upper set of bits of a digital signal at an upper DAC stage, receiving a lower set of bits of a digital signal at a lower DAC stage, and outputting an analog signal from the upper DAC stage and the lower DAC stage, wherein the upper DAC stage comprises an upper set of DAC units, with a first DAC unit in the upper set of DAC units having a different weight than a second DAC unit in the upper set of DAC units, and wherein the lower DAC stage comprises a lower set of DAC units formed in an R-2R resistor ladder network.

BRIEF DESCRIPTION OF THE DRAWINGS

In the following section, the aspects of the subject matter disclosed herein will be described with reference to exemplary embodiments illustrated in the figures, in which.

DETAILED DESCRIPTION

Figure 1:
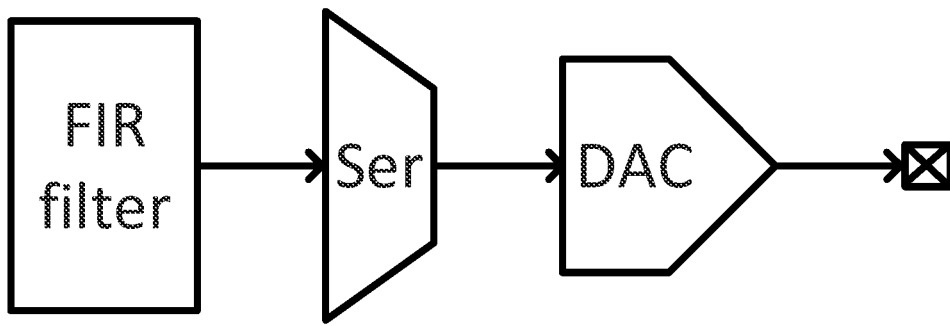
FIG. 1 illustrates a DAC-based transmitter, according to an embodiment.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail to not obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not necessarily all be referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock," "Row Select," "PIXOUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. For example, software may be embodied as a software package, code and/or instruction set or instructions, and the term "hardware," as used in any implementation described herein, may include, for example, singly or in any combination, an assembly, hardwired circuitry, programmable circuitry, state machine circuitry, and/or firmware that stores instructions executed by programmable circuitry. The modules may, collectively or individually, be embodied as circuitry that forms part of a larger system, for example, but not limited to, an integrated circuit (IC), system on-a-chip (SoC), an assembly, and so forth.

FIG. 1 illustrates a DAC-based transmitter, according to an embodiment.

Referring to FIG. 1, a finite impulse response (FIR) filter, a serializer (e.g., a multiplexer), and a digital-to-analog converter (DAC) are included in the DAC-based transmitter. The FIR filter serves as the initial stage, which processes the incoming digital signal to eliminate unwanted noise and to shape the signal spectrum, ensuring that it conforms to desired transmission standards. Following the FIR filter, the serialized digital signal is then directed to the serializer/multiplexer (Ser). This component's role is to convert the parallel output of the FIR filter into a serial data stream, which prepares the digital data for conversion into an analog format. The next stage is the DAC, which performs the function of converting the serialized digital data into an analog signal. The output from the DAC is then fed into the driver output stage, which is responsible for amplifying the signal to suitable levels for transmission.

Figure 2:
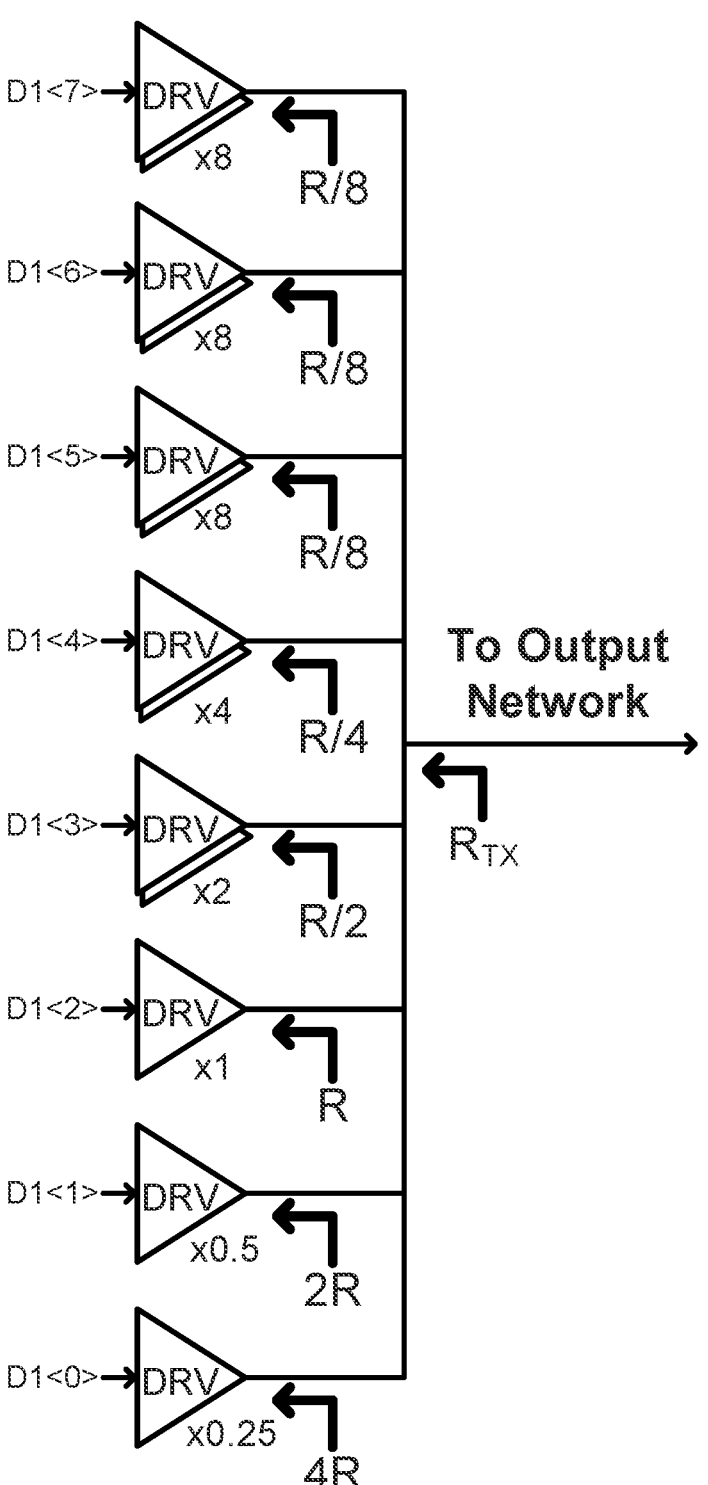
FIG. 2 illustrates the internal structure of a 7-bit DAC-based driver included in a DAC transmitter system, according to an embodiment.

FIG. 2 illustrates the internal structure of a 7-bit DAC-based driver included in a DAC transmitter system, according to an embodiment.

Referring to FIG. 2, DAC sections, each associated with a different bit of the digital signal, labeled D1<0> to D1<7>, starting from a LSB to the most significant bit (MSB) are shown. For example, the LSB may be D1<0> and the MSB may be D1<7>. Additionally, a plurality of LSBs and/or MSBs may be included in the bits D1<0> to D1<7>. The DAC portions are represented with their respective weights and are each connected to a driver DRV for the digital-to-analog conversion process.

Assuming there are three LSBs, D1<0>-D2<2>, the DAC weight for the third LSB D1<2> is the reference weight, denoted as x1 and corresponding to a resistance value of R. This establishes the baseline for the other DAC weights. The weight for the second LSB D1<1> is scaled to half the reference, marked as x0.5 with a corresponding resistance of 2R, while the weight for the first LSB is further reduced to a quarter of the reference, marked as x0.25 with a corresponding resistance of 4R. The remaining bits, from the fourth D1<3> to the seventh D1<7>, are scaled in multiples of the reference weight with respective resistances of R/2, R/4, R/8, R/8, and R/8, thereby indicating an increasing significance of each bit in the digital signal.

Bits D1<5>, D1<6>, and D1<7>, each having weights R/8, are subject to thermometer coding. These bits may all be turned on or off in sequence to represent a specific analog value. The more bits that are set to "1", the higher the value being represented, which results in a finer resolution and typically better linearity compared to other binary-weighted sections. This is because the incremental change from one digital value to the next involves switching the state of exactly one unit, minimizing the potential for glitches or non-linear behavior.

The drivers are connected to an output network, which provides the analog signal for transmission. This network is represented with a transmission resistance, $R_{TX}$, indicating the output stage of the DAC-based driver structure.

The structure shown in FIG. 2 is limited due to the weighting in the DAC design, which is inherently non-uniform due to the decreasing weight of each successive LSB. This non-uniformity is known to impair the linearity of the DAC, a performance parameter that affects the fidelity of the analog signal output.

The present application provides a hybrid DAC-based driver structure integrating an R-2R resistor ladder network for the LSBs of the DAC.

An R-2R resistor ladder network is a circuit structure used in DACs to convert digital signals into analog signals. It includes a series of resistors with values of R and 2R (or R/2 and R, so long as the 1:2 resistor value ratio is maintained) connected in a ladder-like pattern. Digital input signals are applied to nodes of the ladder, and the output voltage is taken from the bottom node. The output voltage is proportional to the digital input code, with each bit of the code contributing a weighted sum to the output.

Figure 3:
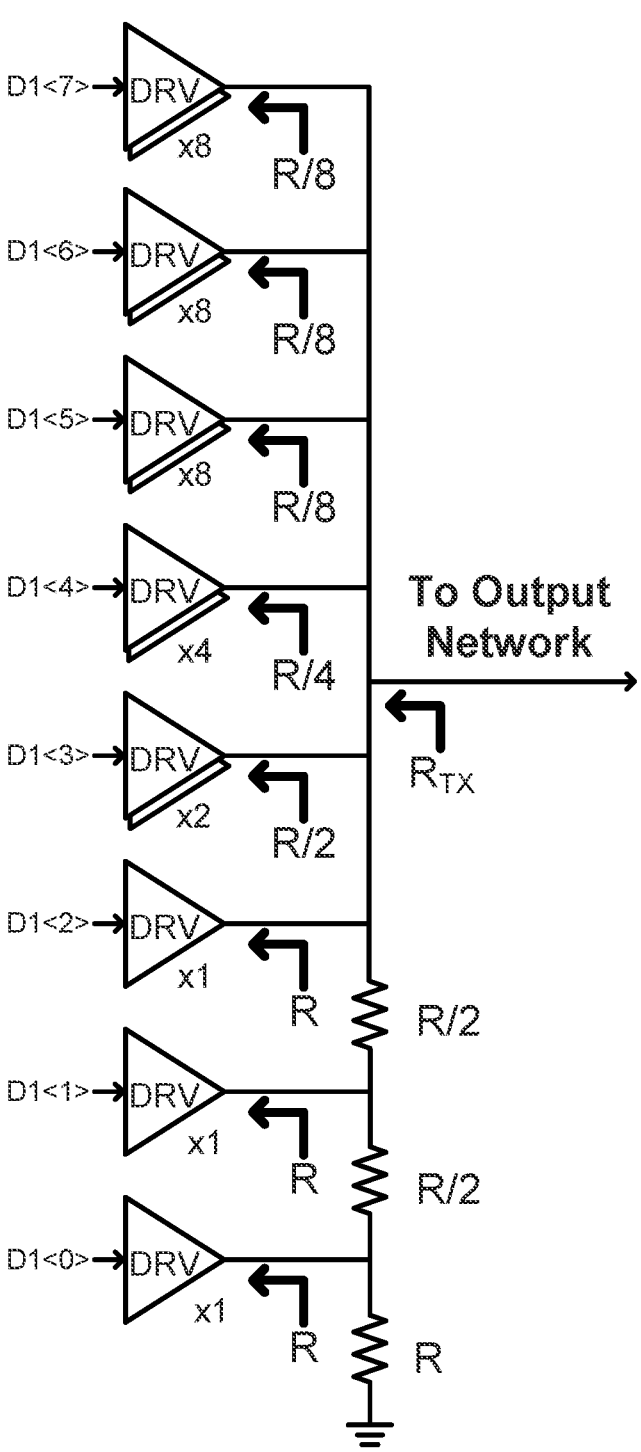
FIG. 3 illustrates the internal structure of a 7-bit hybrid DAC-based driver included in a DAC transmitter system, according to an embodiment.

FIG. 3 illustrates the internal structure of a 7-bit hybrid DAC-based driver included in a DAC transmitter system, according to an embodiment.

Referring to FIG. 3, a hybrid DAC-based driver structure for a 7-bit DAC-based transmitter is shown. The last three LSB DAC sections, corresponding to D1<2>, D1<1>, and D1<0>, employ identical DAC units with resistances R/2, R/2, and R respectively, thereby forming an R-2R ladder network structure. This uniformity in the DAC sections differs from FIG. 2, where the weights of the LSBs scale down non-linearly. By utilizing the R-2R ladder network for these sections, each of the identical units contributes evenly to the output, enhancing the DAC linearity.

The R-2R DAC structure is known for its precision and ease of implementation, especially in creating a linear relationship between the digital input and the analog output. This linearity helps maintain signal integrity, reduce distortion, and improve the overall fidelity of the analog signal.

Furthermore, the drivers (DRVs) associated with each bit are arranged to ensure the proper scaling of the output in conjunction with the R-2R network, resulting in the transmission of the analog signal through the output network characterized by the transmission resistance, $R_{TX}$.

Although a 7-bit DAC-based transmitter design is shown in FIG. 3, more or less bits may be included and designed based on the structure shown. Similarly, 3 LSB bits are shown in the design of FIG. 3, which correspond to the R-2R DAC structure. More or less LSB bits may be employed using the R-2R structure.

Figure 4:
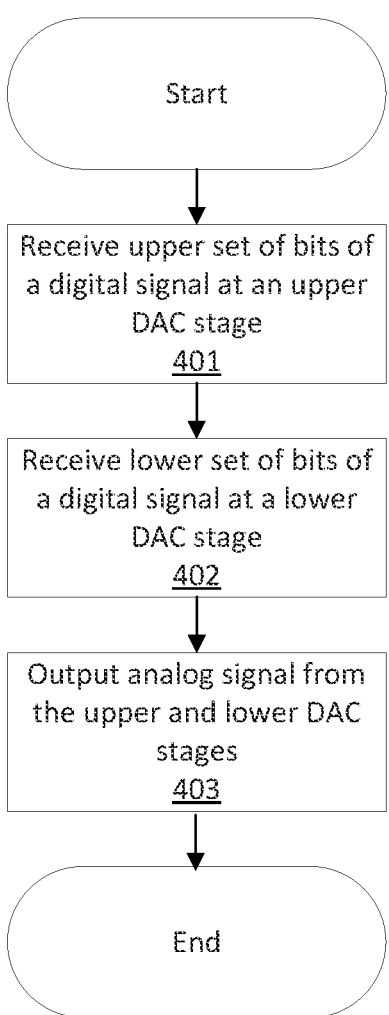
FIG. 4 is a flowchart illustrating a method for driving a load using a hybrid DAC driver, according to an embodiment.

FIG. 4 is a flowchart illustrating a method for driving a load using a hybrid DAC driver, according to an embodiment.

The method disclosed in FIG. 4 may be performed by an electronic device and/or a controller included in the electronic device. The electronic device may include structural components commonly found in electronic circuits that are capable of executing each of the steps.

Referring to FIG. 4, in step 401, an upper set of bits of a digital signal is received at an upper DAC stage. The upper set of bits and/or the upper stage may also be referred to a "first" instead of "upper". The term "upper" may denote that the bits associated with this stage are typically higher number (e.g., bits D1<7> to bits D<3>) than a lower set of bits associated with a lower stage (e.g., bits D<2> to bits D<0>).

The upper set of bits may include one or more bits. Furthermore, the upper DAC stage may include an upper set of DAC units, with a first DAC unit in the upper set of DAC units having a different weight than a second DAC unit in the upper set of DAC units. Also, the upper set of DAC units may comprise one or more MSBs.

The drivers associated with each bit (D1<0> to D1<7>) may correspond to each "DAC unit". Thus, as with reference to FIG. 3, eight DRVs are associated with D1<7>, eight DRVs are associated with D1<6>, eight DRVs are associated with D1<5>, four DRVs are associated with D1<4>, two DRVs are associated with D1<3>, one DRV is associated with D1<2>, one DRV is associated with D1<1>, and one DRV is associated with D1<0>.

Accordingly, a DAC stage may refer to, collectively, one or more of the abovementioned DAC units, and a weight may be associated with each DAC unit. The weight is a relative value of each DAC unit in the driver structure.

For example, in FIG. 3, the input signal is a 7-bit signal, and weights of the DAC units corresponding to D1<0>-D1<2> may be 1, the weight of the DAC unit corresponding to D1<3> may be 0.5, the weight of the DAC unit corresponding to D1<4> may be 0.25, and the weights of the DAC units corresponding to D1<5>-D1<7> may be 0.125.

Referring again to FIG. 4, in step 402, a lower set of bits of a digital signal is received at a lower DAC stage. The lower DAC stage may include a lower set of DAC units formed in an R-2R resistor ladder network. Also, the lower set of DAC units may comprise one or more LSBs.

As explained above, the term "lower" may be used to denote a "second" set of bits and/or DAC stage implying that the bits associated with this DAC stage are typically lower in magnitude than the "upper" (or "first") set of bits.

Furthermore, it is recognized that steps 401 and 402 may be performed in parallel and not sequentially. That is, the upper and lower set of bits may be received simultaneously at the upper and lower stages, and input into their respective drivers.

In step 403, an analog signal may be output by an output stage. The analog signal may be received from the upper DAC stage and the lower DAC stage. For example, the analog signal may be a summation of each output node of the stages corresponding to bits D1<0> to D1<7>.

Figure 5:
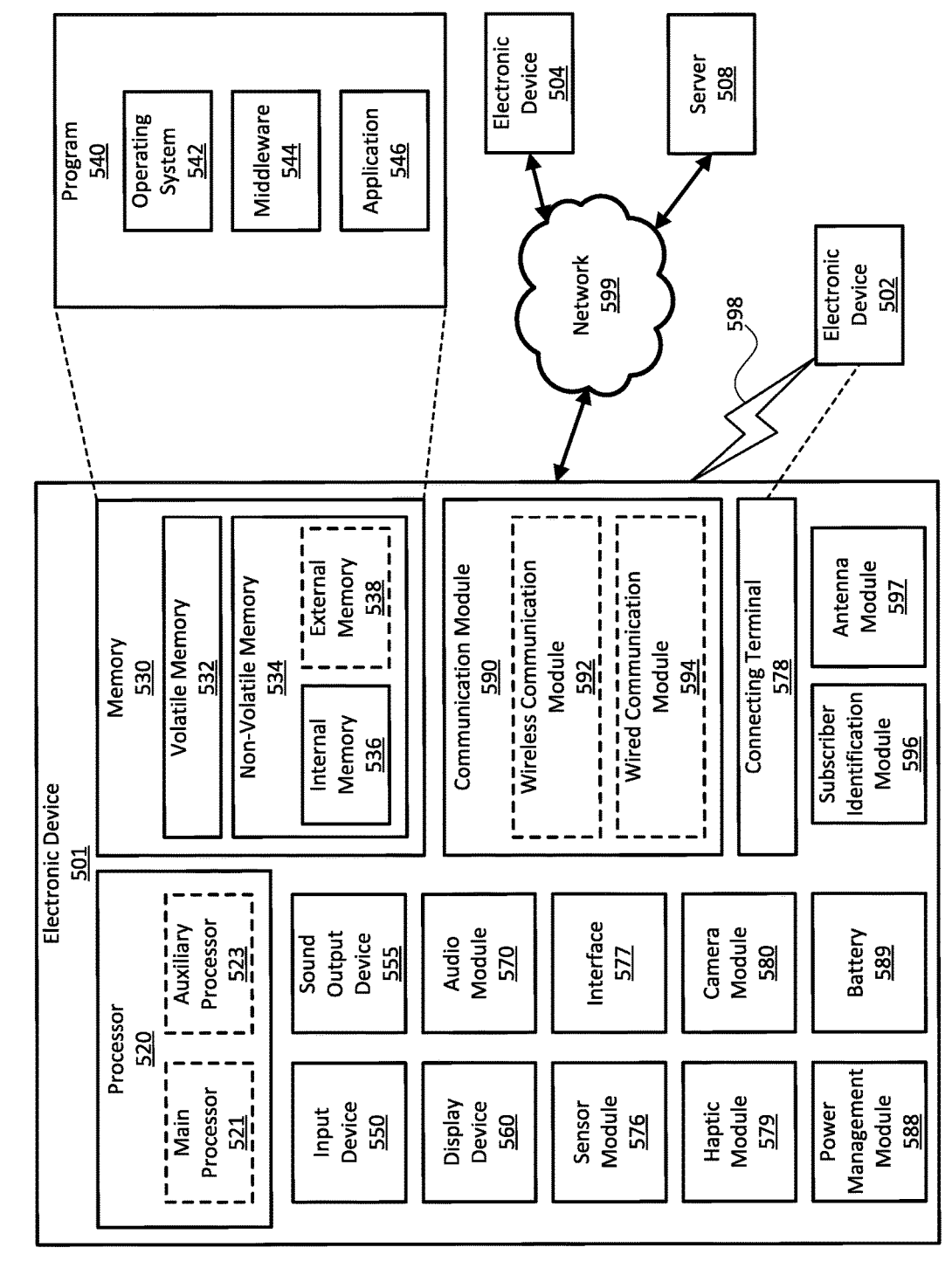
FIG. 5 illustrates an electronic device in a network environment, according to an embodiment.

FIG. 5 illustrates an electronic device in a network environment, according to an embodiment.

Referring to FIG. 5, the electronic device 501, e.g., a mobile terminal including GPS functionality, in the network environment 500 may communicate with an electronic device 502 via a first network 598 (e.g., a short-range wireless communication network), or an electronic device 504 or a server 508 via a second network 599 (e.g., a long-range wireless communication network). The electronic device 501 may communicate with the electronic device 504 via the server 508. The electronic device 501 may include a processor 520, a memory 530, an input device 550, a sound output device 555, a display device 560, an audio module 570, a sensor module 576, an interface 577, a haptic module 579, a camera module 580, a power management module 588, a battery 589, a communication module 590, a subscriber identification module (SIM) 596, or an antenna module 597 including a GNSS antenna. In one embodiment, at least one (e.g., the display device 560 or the camera module 580) of the components may be omitted from the electronic device 501, or one or more other components may be added to the electronic device 501. In one embodiment, some of the components may be implemented as a single integrated circuit (IC). For example, the sensor module 576 (e.g., a fingerprint sensor, an iris sensor, or an illuminance sensor) may be embedded in the display device 560 (e.g., a display).

The processor 520 may execute, for example, software (e.g., a program 540) to control at least one other component (e.g., a hardware or a software component) of the electronic device 501 coupled with the processor 520, and may perform various data processing or computations. As at least part of the data processing or computations, the processor 520 may load a command or data received from another component (e.g., the sensor module 576 or the communication module 590) in volatile memory 532, process the command or the data stored in the volatile memory 532, and store resulting data in non-volatile memory 534. The processor 520 may include a main processor 521 (e.g., a central processing unit (CPU) or an application processor, and an auxiliary processor 523 (e.g., a graphics processing unit (GPU), an image signal processor (ISP), a sensor hub processor, or a communication processor (CP)) that is operable independently from, or in conjunction with, the main processor 521. Additionally or alternatively, the auxiliary processor 523 may be adapted to consume less power than the main processor 521, or execute a particular function. The auxiliary processor 523 may be implemented as being separate from, or a part of, the main processor 521.

The auxiliary processor 523 may control at least some of the functions or states related to at least one component (e.g., the display device 560, the sensor module 576, or the communication module 590) among the components of the electronic device 501, instead of the main processor 521 while the main processor 521 is in an inactive (e.g., sleep) state, or together with the main processor 521 while the main processor 521 is in an active state (e.g., executing an application). According to one embodiment, the auxiliary processor 523 (e.g., an ISP or a CP) may be implemented as part of another component (e.g., the camera module 580 or the communication module 590) functionally related to the auxiliary processor 523.

The memory 530 may store various data used by at least one component (e.g., the processor 520 or the sensor module 576) of the electronic device 501. The various data may include, for example, software (e.g., the program 540) and input data or output data for a command related thereto. The memory 530 may include the volatile memory 532 or the non-volatile memory 534.

The program 540 may be stored in the memory 530 as software, and may include, for example, an operating system (OS) 542, middleware 544, or an application 546.

The input device 550 may receive a command or data to be used by other component (e.g., the processor 520) of the electronic device 501, from the outside (e.g., a user) of the electronic device 501. The input device 550 may include, for example, a microphone, a mouse, or a keyboard.

The sound output device 555 may output sound signals to the outside of the electronic device 501. The sound output device 555 may include, for example, a speaker or a receiver. The speaker may be used for general purposes, such as playing multimedia or recording, and the receiver may be used for receiving an incoming call. According to one embodiment, the receiver may be implemented as being separate from, or a part of, the speaker.

The display device 560 may visually provide information to the outside (e.g., a user) of the electronic device 501. The display device 560 may include, for example, a display, a hologram device, or a projector and control circuitry to control a corresponding one of the display, hologram device, and projector. According to one embodiment, the display device 560 may include touch circuitry adapted to detect a touch, or sensor circuitry (e.g., a pressure sensor) adapted to measure the intensity of force incurred by the touch.

The audio module 570 may convert a sound into an electrical signal and vice versa. According to one embodiment, the audio module 570 may obtain the sound via the input device 550, or output the sound via the sound output device 555 or a headphone of an external electronic device 502 directly (e.g., wiredly) or wirelessly coupled with the electronic device 501.

The sensor module 576 may detect an operational state (e.g., power or temperature) of the electronic device 501 or an environmental state (e.g., a state of a user) external to the electronic device 501, and then generate an electrical signal or data value corresponding to the detected state. The sensor module 576 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 577 may support one or more specified protocols to be used for the electronic device 501 to be coupled with the external electronic device 502 directly (e.g., wiredly) or wirelessly. According to one embodiment, the interface 577 may include, for example, a high definition multimedia interface (HDMI), a universal serial bus (USB) interface, a secure digital (SD) card interface, or an audio interface.

A connecting terminal 578 may include a connector via which the electronic device 501 may be physically connected with the external electronic device 502. According to one embodiment, the connecting terminal 578 may include, for example, an HDMI connector, a USB connector, an SD card connector, or an audio connector (e.g., a headphone connector).

The haptic module 579 may convert an electrical signal into a mechanical stimulus (e.g., a vibration or a movement) or an electrical stimulus which may be recognized by a user via tactile sensation or kinesthetic sensation. According to one embodiment, the haptic module 579 may include, for example, a motor, a piezoelectric element, or an electrical stimulator.

The camera module 580 may capture a still image or moving images. According to one embodiment, the camera module 580 may include one or more lenses, image sensors, ISPs, or flashes.

The power management module 588 may manage power supplied to the electronic device 501. The power management module 588 may be implemented as at least part of, for example, a power management integrated circuit (PMIC).

The battery 589 may supply power to at least one component of the electronic device 501. According to one embodiment, the battery 589 may include, for example, a primary cell which is not rechargeable, a secondary cell which is rechargeable, or a fuel cell.

The communication module 590 may support establishing a direct (e.g., wired) communication channel or a wireless communication channel between the electronic device 501 and the external electronic device (e.g., the electronic device 502, the electronic device 504, or the server 508) and performing communication via the established communication channel. The communication module 590 may include one or more CPs that are operable independently from the processor 520 (e.g., the application processor) and supports a direct (e.g., wired) communication or a wireless communication. According to one embodiment, the communication module 590 may include a wireless communication module 592 (e.g., a cellular communication module, a short-range wireless communication module, or a global navigation satellite system (GNSS) communication module) or a wired communication module 594 (e.g., a local area network (LAN) communication module or a power line communication (PLC) module). A corresponding one of these communication modules may communicate with the external electronic device via the first network 598 (e.g., a short-range communication network, such as Bluetooth™, wireless-fidelity (Wi-Fi) direct, or a standard of the Infrared Data Association (IrDA)) or the second network 599 (e.g., a long-range communication network, such as a cellular network, the Internet, or a computer network (e.g., LAN or wide area network (WAN)). These various types of communication modules may be implemented as a single component (e.g., a single IC), or may be implemented as multiple components (e.g., multiple ICs) that are separate from each other. The wireless communication module 592 may identify and authenticate the electronic device 501 in a communication network, such as the first network 598 or the second network 599, using subscriber information (e.g., international mobile subscriber identity (IMSI)) stored in the subscriber identification module 596.

The antenna module 597 may transmit or receive a signal or power to or from the outside (e.g., the external electronic device) of the electronic device 501. According to one embodiment, the antenna module 597 may include one or more antennas, and, therefrom, at least one antenna appropriate for a communication scheme used in the communication network, such as the first network 598 or the second network 599, may be selected, for example, by the communication module 590 (e.g., the wireless communication module 592). The signal or the power may then be transmitted or received between the communication module 590 and the external electronic device via the selected at least one antenna.

At least some of the above-described components may be mutually coupled and communicate signals (e.g., commands or data) therebetween via an inter-peripheral communication scheme (e.g., a bus, a general purpose input and output (GPIO), a serial peripheral interface (SPI), or a mobile industry processor interface (MIPI)).

According to one embodiment, commands or data may be transmitted or received between the electronic device 501 and the external electronic device 504 via the server 508 coupled with the second network 599. Each of the electronic devices 502 and 504 may be a device of a same type as, or a different type, from the electronic device 501. All or some of operations to be executed at the electronic device 501 may be executed at one or more of the external electronic devices 502, 504, or 508. For example, if the electronic device 501 should perform a function or a service automatically, or in response to a request from a user or another device, the electronic device 501, instead of, or in addition to, executing the function or the service, may request the one or more external electronic devices to perform at least part of the function or the service. The one or more external electronic devices receiving the request may perform the at least part of the function or the service requested, or an additional function or an additional service related to the request and transfer an outcome of the performing to the electronic device 501. The electronic device 501 may provide the outcome, with or without further processing of the outcome, as at least part of a reply to the request. To that end, a cloud computing, distributed computing, or client-server computing technology may be used, for example.

One embodiment may be implemented as software (e.g., the program 540) including one or more instructions that are stored in a storage medium (e.g., internal memory 536 or external memory 538) that is readable by a machine (e.g., the electronic device 501). For example, a processor of the electronic device 501 may invoke at least one of the one or more instructions stored in the storage medium, and execute it, with or without using one or more other components under the control of the processor. Thus, a machine may be operated to perform at least one function according to the at least one instruction invoked. The one or more instructions may include code generated by a complier or code executable by an interpreter. A machine-readable storage medium may be provided in the form of a non-transitory storage medium. The term "non-transitory" indicates that the storage medium is a tangible device, and does not include a signal (e.g., an electromagnetic wave), but this term does not differentiate between where data is semi-permanently stored in the storage medium and where the data is temporarily stored in the storage medium.

According to one embodiment, a method of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to one embodiment, each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In this case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. A hybrid digital-to-analog converter (DAC) driver, comprising:

an upper DAC stage configured to receive an upper set of bits of a digital signal, the upper DAC stage comprising an upper set of DAC units, wherein the upper set of DAC units comprises a first DAC unit corresponding to a first bit in the upper set of bits having a different weight than a second DAC unit corresponding to a second bit in the upper set of bits;

a lower DAC stage configured to receive a lower set of bits of the digital signal, the lower DAC stage comprising a lower set of DAC units each having a same weight and formed in an R-2R resistor ladder network; and an output stage for outputting an analog signal from the upper DAC stage and the lower DAC stage.

2. The hybrid DAC driver of claim 1, wherein the lower set of DAC units comprises one or more least significant bits (LSBs).

3. The hybrid DAC driver of claim 1, wherein the upper set of DAC units comprises one or more most significant bits (MSBs).

4. The hybrid DAC driver of claim 1, wherein the lower set of DAC units comprises three least significant bits (LSBs).

5. The hybrid DAC driver of claim 1, wherein each DAC unit included in the lower set of DAC units has an identical reference DAC weight.

6. The hybrid DAC driver of claim 1, wherein each DAC unit included in the lower set of DAC units is identical.

7. The hybrid DAC driver of claim 1, wherein the upper set of DAC units comprises five bits, and the lower set of DAC units comprises three bits.

8. The hybrid DAC driver of claim 1, wherein the total number of DAC units included in the upper set of DAC units and the lower set of DAC units is eight.

9. The hybrid DAC driver of claim 1, wherein the upper DAC stage and the lower DAC stage are both used together to generate the output by converting a digital signal into an analog signal.

10. A method for driving a load using a hybrid digital-to-analog converter (DAC) driver, comprising:

receiving an upper set of bits of a digital signal at an upper DAC stage, receiving a lower set of bits of a digital signal at a lower DAC stage, and outputting an analog signal from the upper DAC stage and the lower DAC stage, wherein the upper DAC stage comprises an upper set of DAC units, the upper set of DAC units comprises a first DAC unit corresponding to a first bit in the upper set of bits having a different weight than a second DAC unit corresponding to a second bit in the upper set of bits, and wherein the lower DAC stage comprises a lower set of DAC units each having a same weight and formed in an R-2R resistor ladder network.

11. The method of claim 10, wherein the lower set of DAC units comprises one or more least significant bits (LSBs).

12. The method of claim 10, wherein the upper set of DAC units comprises one or more most significant bits (MSBs).

13. The method of claim 10, wherein the lower set of DAC units comprises three least significant bits (LSBs).

14. The method of claim 10, wherein each DAC unit included in the lower set of DAC units has an identical reference DAC weight.

15. The method of claim 10, wherein each DAC unit included in the lower set of DAC units is identical.

16. The method of claim 10, wherein the upper set of DAC units comprises five bits, and the lower set of DAC units comprises three bits.

17. The method of claim 10, wherein the total number of DAC units included in the upper set of DAC units and the lower set of DAC units is eight.

18. The method of claim 10, wherein the upper DAC stage and the lower DAC stage are both used together to generate the output by converting a digital signal into an analog signal.

* * * * *